(12) United States Patent
Shay et al.

(10) Patent No.: US 10,418,961 B2
(45) Date of Patent: Sep. 17, 2019

(54) DUAL-MODE FILTERING ACTUATOR DRIVER APPARATUS, SYSTEMS AND METHODS

(71) Applicant: TEXAS INSTRUMENTS INCORPORATED, Dallas, TX (US)

(72) Inventors: Michael John Shay, Fairview, TX (US); Jialei Xu, Cupertino, CA (US); Randy A. Chappel, Quinlan, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 29 days.

(21) Appl. No.: 15/809,196

(22) Filed: Nov. 10, 2017

(65) Prior Publication Data
US 2018/0091110 A1    Mar. 29, 2018

Related U.S. Application Data

(62) Division of application No. 14/558,718, filed on Dec. 2, 2014, now Pat. No. 9,887,680.

(51) Int. Cl.
*H03H 1/02* (2006.01)
*H03H 9/00* (2006.01)
*H03H 11/04* (2006.01)
*H03H 1/00* (2006.01)

(52) U.S. Cl.
CPC ............ *H03H 1/02* (2013.01); *H03H 1/0007* (2013.01); *H03H 9/00* (2013.01); *H03H 11/04* (2013.01)

(58) Field of Classification Search
CPC .......... H03H 1/02; H03H 1/0007; H03H 7/06; H03H 11/06; H03H 11/04; H03H 9/00
USPC ....................................... 333/17.1, 172, 186
See application file for complete search history.

(56) References Cited

U.S. PATENT DOCUMENTS 4,710,686 A    12/1987  Guzik
8,482,340 B2    7/2013  Shay et al.

*Primary Examiner* — Rakesh B Patel
(74) *Attorney, Agent, or Firm* — Michael A. Davis, Jr.; Charles A. Brill; Frank D. Cimino

(57) ABSTRACT

In an actuator driver array, each actuator driver includes a transition stage to initiate a state change of a driver output signal, a static stage to maintain the state change, and an isolation resistor to couple the driver output signal to an output node of the actuator driver during a static mode. In an array of pad capacitors, each pad capacitor has: a first terminal at a connector pad communicatively coupled to the output node; and a second terminal coupled to an RF ground rail. The isolation resistor and the pad capacitor form a low-pass filter to filter RF harmonics from a respective actuator driver to respective actuator circuitry, and to filter RF energy generated outside of the respective actuator driver to its output node. In an RF actuator array, a state of each element is controllable by a corresponding actuator driver in the actuator driver array.

6 Claims, 7 Drawing Sheets

DUAL-MODE FILTERING ACTUATOR DRIVER APPARATUS, SYSTEMS AND METHODS

CROSS-REFERENCE TO RELATED APPLICATION

This application is a divisional of U.S. patent application Ser. No. 14/558,718 filed Dec. 2, 2014, which is hereby fully incorporated herein by reference.

BACKGROUND

This relates to apparatus, systems and methods associated with electronically driving actuator apparatus including radio frequency switches.

Arrays of radio frequency ("RF") switches are used in the fields of communication, test and instrumentation, and RF microphones, among others. Such RF switch arrays are increasingly implemented using RF micro-electromechanical ("MEMS") devices. RF MEMS devices in this context may include MEMS arrays of tunable inductors, switched capacitors, and varactors in addition to simple switches. RF switching arrays implemented with RF MEMS devices include the advantages of compact size and low power dissipation. Although the switching element input voltage for such devices is relatively high for semiconductor devices (e.g., typically 30-40 volts DC), each MEMS element requires only a small or near-zero drive current to maintain its state following a state transition.

The design of electronic drivers for the above-described RF switch arrays can present challenges. RF energy from driven devices may conduct back from an RF switching element in the array to the driver for that element. The RF energy may generate inter-modulation products through mixing within the driver transistors. The inter-modulation products may reflect back out into the RF channel. Conversely, spurious noise from driver elements may leak into the RF switch array. The latter driver-initiated interference is referred to hereinafter as "spurious noise." Spurious noise may include, for example, noise from a power supply providing the high drive voltage to bias the RF switch elements.

Spurious noise leakage may cause subtle but significant variations in sensitive parameters such as the capacitance of a MEMS varactor element or result in inter-modulation distortion by mixing the baseband with the RF band carrier.

SUMMARY

In an array of dual-mode actuator drivers (actuator driver array), each actuator driver includes a transition stage to initiate a state change of a driver output signal, a static stage to maintain the state change of the driver output signal, and an isolation resistor to couple the driver output signal from the static stage to an output node of the actuator driver during a static mode of operation. In an array of pad capacitors, each pad capacitor has: a first terminal at a connector pad communicatively coupled to the output node; and a second terminal coupled to a radio frequency ("RF") ground rail. The isolation resistor and the pad capacitor form a low-pass filter to filter RF harmonics from a respective actuator driver in the actuator driver array to respective actuator circuitry, and to filter RF energy generated outside of the respective actuator driver to its output node. In an array of RF actuator elements (RF actuator array), a state of each element of the RF actuator array is controllable by a corresponding actuator driver in the actuator driver array.

DETAILED DESCRIPTION OF EXAMPLE EMBODIMENTS

Structures and methods described herein provide transition and statically held drive signals to an RF actuator device or to an array of RF actuator devices such as may be included in a MEMS array. A dual-mode driver includes a transition stage and a static stage. The transition stage switches a high bias voltage to an output pad directly from a high voltage power supply rail in order to change the state of an RF actuator device connected at the driver output pad. "High voltage" and "high bias voltage" in the context of this description means a voltage in the range of 30-40 volts DC as is typically used for state changes of MEMS elements. Likewise, the transition stage of the dual-mode driver switches the output pad directly to an RF ground potential in order to transition the state of the connected RF actuator device.

After waiting a predetermined period of time for the RF actuator device to change state, the transition stage of the dual-mode driver is disabled. A high-side or low-side static stage transistor maintains the state of the driver output voltage previously transitioned-to through an isolation resistor. The isolation resistor and a capacitor formed at the driver output pad form an RC low-pass filter to block spurious noise generated at the driver and/or within the switching circuitry associated with the driver high voltage power supply. The RC low-pass filter also blocks RF energy from the RF actuator that might otherwise enter into and disrupt operation of the actuator driver.

Some embodiments also include a second RC filter termed "pad filter" herein. The pad filter is formed proximate to the output pad as further described hereinbelow. The pad filter serves to filter RF energy generated in RF circuitry switched or controlled by the actuator and helps to prevent such energy from entering the actuator driver.

Figure 1:
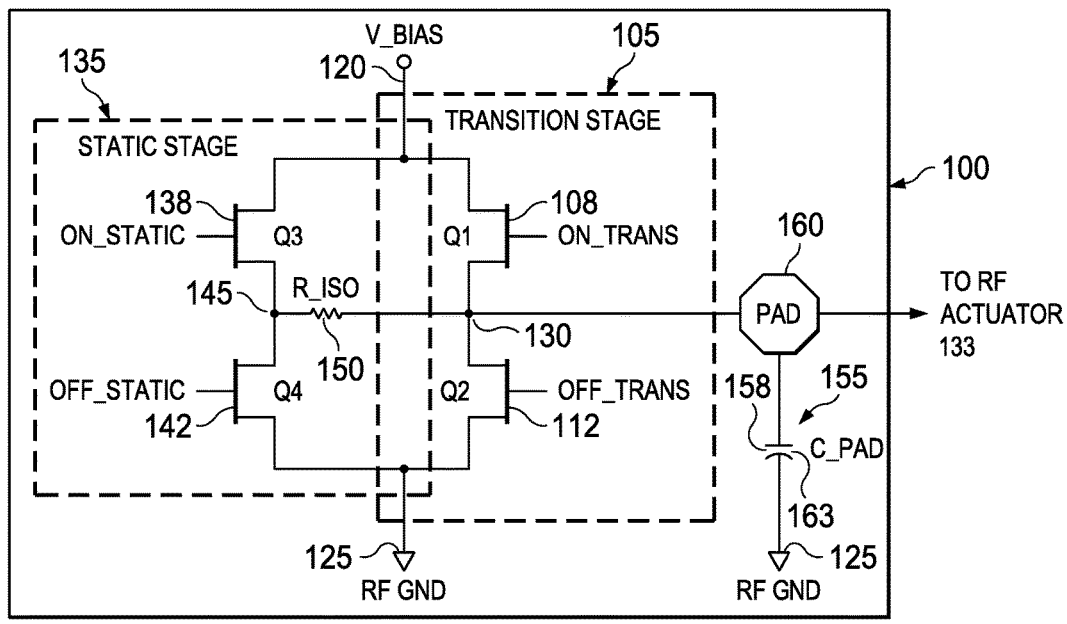
FIG. 1 is a schematic diagram of a dual-mode filtering actuator driver apparatus according to example embodiments.

FIG. 1 is a schematic diagram of a dual-mode filtering actuator driver apparatus 100 according to example embodiments. The driver 100 includes a transition stage 105. The transition stage 105 includes two or more transition stage transistors (e.g., the transistors Q1 108 and Q2 112). The transition stage transistors 108 and 112 are coupled in series between a power supply voltage rail 120 and an RF ground rail 125 and are joined at an output node 130. One or more of the transition stage transistors conducts during a state change at the output node 130 and are turned off at the end of a predetermined period of time after the state change. A DC voltage associated with the power supply rail 120 is substantially equal to an actuation bias voltage associated with an actuator 133 to be controlled by the driver 100.

The actuator driver 100 also includes a static stage 135. The static stage 135 includes two or more static stage transistors (e.g., the transistors Q3 138 and Q4 142). The static stage transistors 138 and 142 are coupled in series between the supply voltage rail 120 and the RF ground rail 125 and are joined at an isolation node 145. One or more of the static stage transistors continues to conduct following the predetermined period of time after the state change in order to maintain the state change after the transition stage 105 becomes inactive.

The actuator driver 100 further includes an isolation resistor 150 coupled between the isolation node 145 and the output node 130. The driver 100 also includes a pad capacitor 155. A first terminal 158 of the pad capacitor 155 is located at a connector pad 160. The connector pad 160 is communicatively coupled to the output node 130. A second terminal 163 of the pad capacitor 155 is coupled to the RF ground rail 125. The isolation resistor 150 and the pad capacitor 155 form a low-pass filter to filter RF harmonics from the actuator driver 100 to circuitry associated with the actuator 133. The low-pass filter formed by the isolation resistor 150 and the pad capacitor 155 also filters RF energy generated outside of the actuator driver 100 at the connector pad 160.

Various RF actuator devices 133 may be controlled by the actuator driver 100. The RF actuator device 133 may, for example, be an element of a MEMS array such as a MEMS RF switching array, a MEMS tunable inductor array, a MEMS capacitor array, a MEMS switched capacitor array or a MEMS varactor array.

Figure 2:
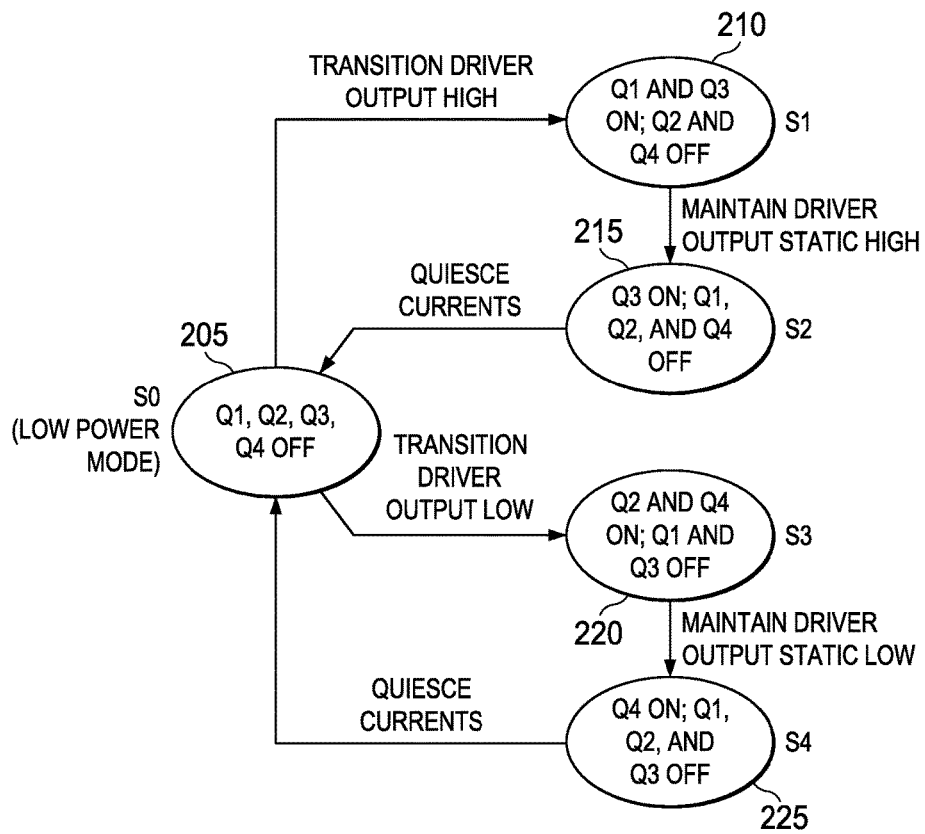
FIG. 2 is a state diagram illustrating various example states of a dual-mode filtering actuator driver apparatus.

FIG. 2 is a state diagram illustrating various example states of the dual-mode filtering actuator driver apparatus 100. With no transistors conducting, the driver 100 is in a low power state S0 205 and the output node 130 is at a high impedance level. To transition the output node 130 high from state S0 205, transistors Q1 108 and Q3 138 are turned on and transistors Q2 112 and Q4 142 are turned off at state S1 210. Transistor Q1 108 is then turned off after the driven actuator 133 has had time to change state, resulting in a static ON state S2 215 of the driver 100. The low-pass RC filter made up of the isolation resistor 150 and the pad capacitor 155 also becomes active at S2 215 as the isolation resistor 150 is placed in series with the output path.

To transition the output node 130 low from state S0 205, transistors Q2 112 and Q4 142 are turned on and transistors Q1 108 and Q3 138 are turned off at state S3 220. Transistor Q2 112 is then turned off after the driven actuator 133 has had time to change state, resulting in a static OFF state S4 225 of the driver 100. The low-pass RC filter also becomes active at S4 225 as the isolation resistor 150 is placed in series with the output path.

Figure 3A:
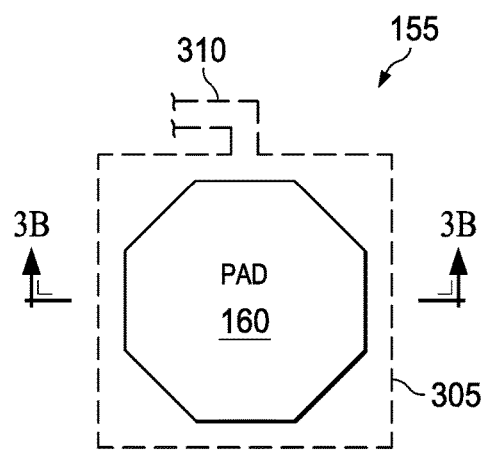
FIG. 3A is a top-down view of an example embodiment of a dual-mode filtering actuator driver pad capacitor.

FIG. 3A is a top-down view of an example embodiment of the dual-mode filtering actuator driver pad capacitor 155 of FIG. 1. Some versions of the pad capacitor 155 may include the pad 160 itself. That is, the pad capacitor 155 may include a metallic top plate 160A formed by the connector pad 160. The pad capacitor 155 may also include a metallic bottom plate 305 formed at a layer under the connector pad 160. The metallic bottom plate 305 includes an RF ground return path 310 coupled between the bottom plate 305 and the RF ground rail 125 of FIG. 1.

Figure 3B:
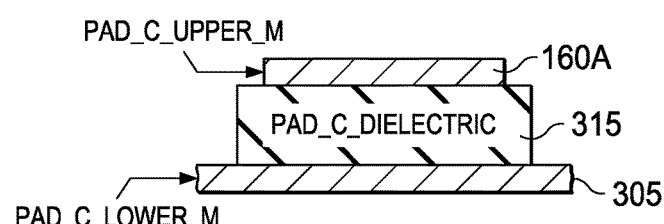
FIG. 3B is a cross-sectional view of an example embodiment of a dual-mode filtering actuator driver pad capacitor.

FIG. 3B is a cross-sectional view of the example driver pad capacitor 155. The metallic top plate 160A is separated from the metallic bottom plate 305 by a dielectric layer 315 formed between the metallic top plate 160A and the metallic bottom plate 305.

Figure 4:
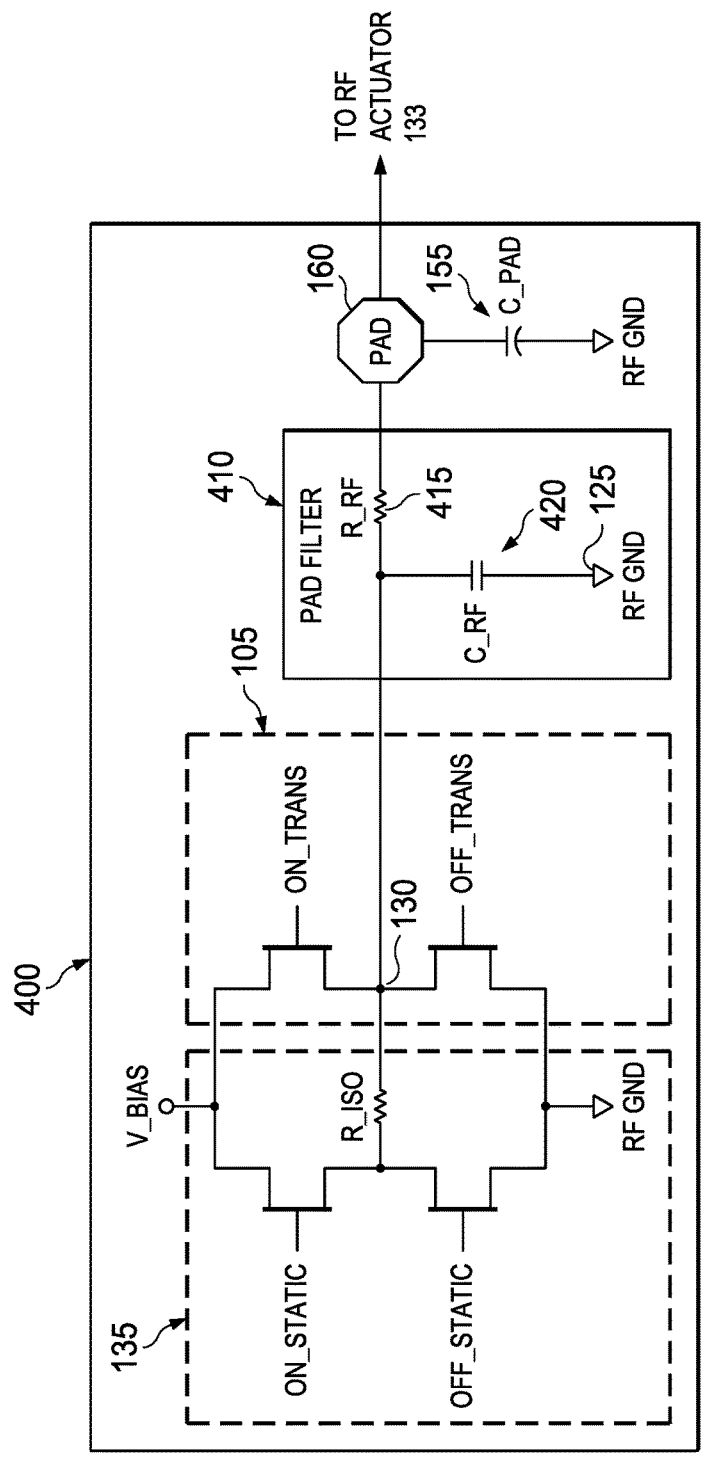
FIG. 4 is a schematic diagram of a dual-mode filtering actuator driver apparatus according to various example embodiments.

FIG. 4 is a schematic diagram of a dual-mode filtering actuator driver apparatus 400 according to various example embodiments. The actuator driver 400 includes the transition stage 105, the static stage 135, the pad capacitor 155 and the pad 160, all as described hereinabove with reference to the actuator driver apparatus 100 of FIG. 1.

The actuator driver 400 also includes an RC pad filter 410 proximate to the connector pad 160. The pad filter 410 filters RF energy from an RF actuator 133 to the actuator driver 400. The pad filter 410 includes a pad filter resistor 415 coupled in series between the connector pad 160 and a switching stage output terminal 130. The pad filter 410 also includes a metal capacitor 420 coupled between a junction of the pad filter resistor 415 with the output node 130 and the RF ground rail 125.

Figure 5A:
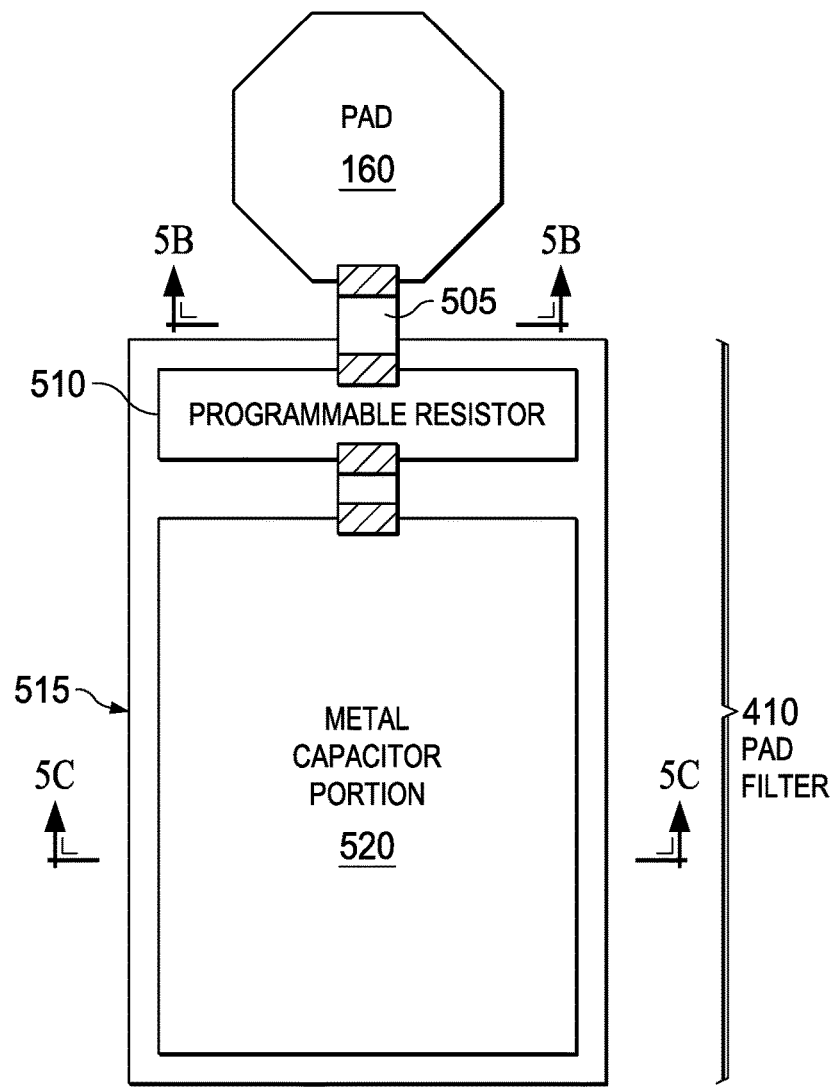
FIG. 5A is a top-down view of an example embodiment of a dual-mode filtering actuator driver connector pad and an associated pad filter implemented with semiconductor materials.

FIG. 5A is a top-down view of an example embodiment of a dual-mode filtering actuator driver connector pad 160 and an associated pad filter 410 implemented with semiconductor materials. The connector pad 160 is coupled via a shielded conductive route 505 to a resistor portion 510 of an area 515 occupied by the pad filter 410. The resistor portion 510 is coupled to a metal capacitor portion 520 of the area 515. The resistor portion 515 may include multiple resistor segments reconfigurable in various series and/or parallel combinations to provide a programmable resistance.

Figure 5B:
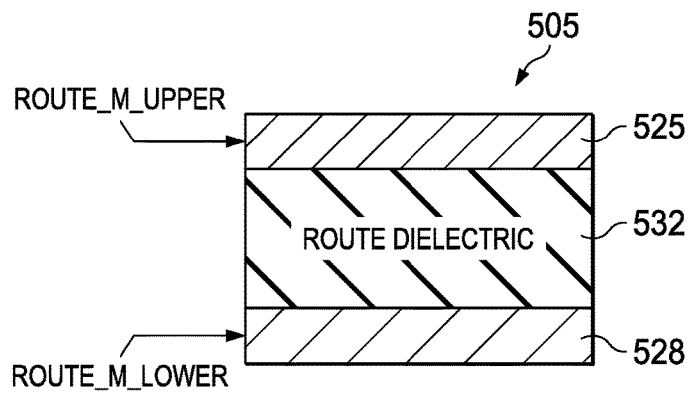
FIG. 5B is a cross-sectional view of an example embodiment of a shielded conductive route between a dual-mode filtering actuator driver connector pad and an associated pad filter resistor.

FIG. 5B is a cross-sectional view of an example embodiment of a shielded conductive route 505 between a dual-mode filtering actuator driver connector pad 160 and an associated pad filter resistor 415. The shielded conductive route 505 includes an upper metallic layer 525 to couple between the connector pad 160 and the pad filter resistor 415. The shielded conductive route 505 also includes an isolated lower metallic layer 528 to provide an RF shield to the upper metallic layer 525. The conductive route 505 further includes a route dielectric 532 formed between the upper metallic layer 525 and the isolated lower metallic layer 528.

Figure 5C:
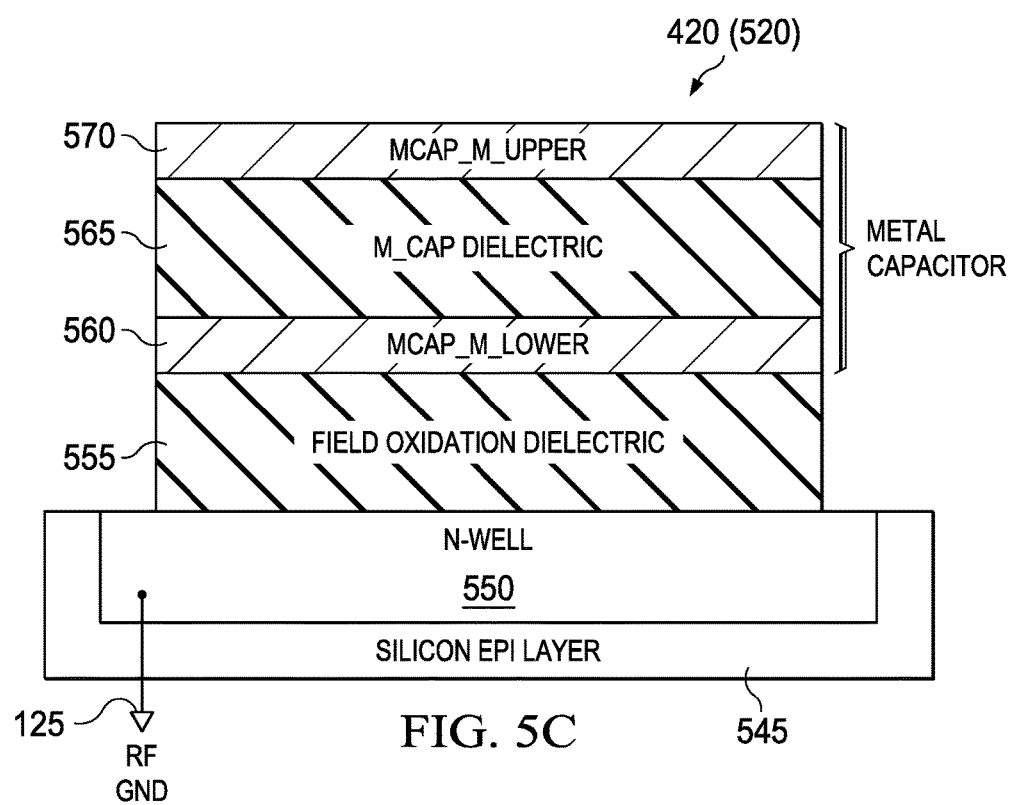
FIG. 5C is a cross-sectional view of an example embodiment of a metal capacitor portion of a pad filter associated with a dual-mode filtering actuator driver.

FIG. 5C is a cross-sectional view of an example embodiment of a metal capacitor 420 (e.g., the metal capacitor portion 520 of FIG. 5A) of a pad filter 410 associated with the dual-mode filtering actuator driver 400 of FIG. 4. The metal capacitor 420 includes a silicon epitaxial layer 545 on a silicon substrate (not shown). The metal capacitor 420 also includes an n-well 550 formed in the silicon epitaxial layer 545. The n-well 550 is coupled to the RF ground rail 125. The metal capacitor 420 also includes a field oxidation dielectric layer 555 formed on the n-well 550. The metal capacitor 420 further includes a cathode formed as a lower metallic layer 560 on the field oxidation layer 555. A metal capacitor dielectric layer 565 is formed on the lower metallic layer 560. An anode of the metal capacitor 420 is formed as an upper metallic layer 570 on the dielectric layer 565.

Figure 6:
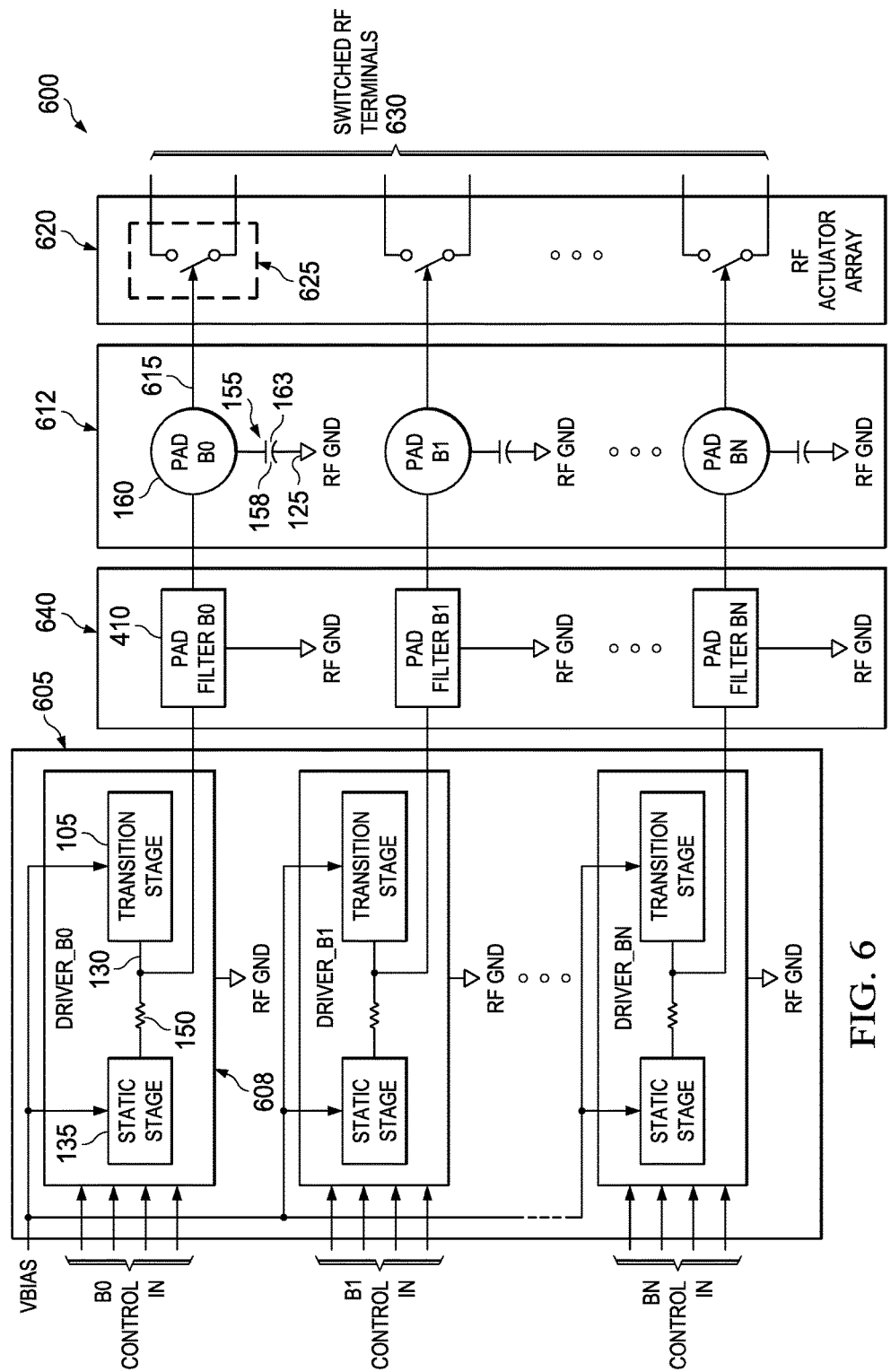
FIG. 6 is a block diagram of a dual-mode filtering actuation system according to various example embodiments.

FIG. 6 is a block diagram of a dual-mode filtering actuation system 600 according to various example embodiments. The actuation system 600 includes an array of dual-mode actuator drivers 605. Each actuator driver (e.g., the actuator driver bit zero 608) controls a state of a drive signal at the driver output. The output states include a high bias voltage state substantially equal to a voltage of a power supply voltage rail, a low voltage state substantially equal to a voltage potential of an RF ground rail, and a high impedance state.

Each actuator driver of the array 605 includes a transition stage (e.g., the transition stage 105). The transition stage initiates a state change of an associated driver output signal. The transition stage corresponding to each actuator driver includes two or more transition stage transistors coupled together as described hereinabove for the actuator driver 100 of FIG. 1.

Each actuator driver of the driver array 605 also includes a static stage (e.g., the static stage 135) communicatively coupled to the transition stage. The static stage maintains the state change of the driver output signal after the transition stage is quiesced as described hereinabove. The static stage corresponding to each actuator driver includes two or more transition stage transistors coupled together as described hereinabove for the actuator driver 100 of FIG. 1.

Each actuator driver of the array 605 further includes an isolation resistor (e.g., the isolation resistor 150). The isolation resistor couples the output signal from the static stage to an output node (e.g., the output node 130) of the actuator driver during a static mode of operation.

The dual-mode filtering actuation system 600 also includes an array of pad capacitors 612. Each pad capacitor of the array 612 (e.g., the pad capacitor 155) includes a first terminal (e.g., the terminal 158) at a connector pad (e.g., the connector pad 160) communicatively coupled to the corresponding output node (e.g., the output node 130). Each pad capacitor also includes a second terminal (e.g., the terminal 163) coupled to an RF ground rail 125. The isolation resistor and the pad capacitor associated with a particular actuator driver form a low-pass filter. The low-pass filter filters RF harmonics from the actuator driver to actuator circuitry and filters RF energy generated outside of the actuator driver at the actuator driver output (e.g., at the output 615).

The actuation system 600 further includes an array of RF actuator elements 620. A state of each element (e.g., the switching element 625) of the RF actuator array is controlled by a corresponding actuator driver in the actuator driver array 605. The RF actuator array elements act upon RF signals at the output terminals 630 of the actuator array 620. An array of RF switching elements, for example, selectively switches RF signals at the output terminals 630.

Although the actuator elements in the example RF actuator array 620 are shown as switching elements, the array elements may be of various types including RF switches, tunable inductors, switched capacitors and/or varactors. A varactor array may, for example, selectively change the phase of RF signals presented at the array output terminals 630. The actuator array 620 may in some embodiments be implemented as a MEMS array such as a MEMS RF switching array, a MEMS tunable inductor array, a MEMS capacitor array, a MEMS switched capacitor array, and/or a MEMS varactor array.

Some versions of the dual-mode filtering actuation system 600 also include an array of RC low-pass pad filters 640 to provide additional filtering of RF energy that might otherwise enter the driver array 605 from the actuator array 620. Each RC pad filter (e.g., the pad filter 410) is situated proximate to a corresponding connector pad (e.g., the connector pad 160). Each RC pad filter filters RF energy from a corresponding actuator element (e.g., the actuator element 625) to a corresponding actuator driver (e.g., the driver 608). Each pad filter is constructed as described hereinabove with reference to FIGS. 4, 5A, 5B and 5C.

Figure 7:
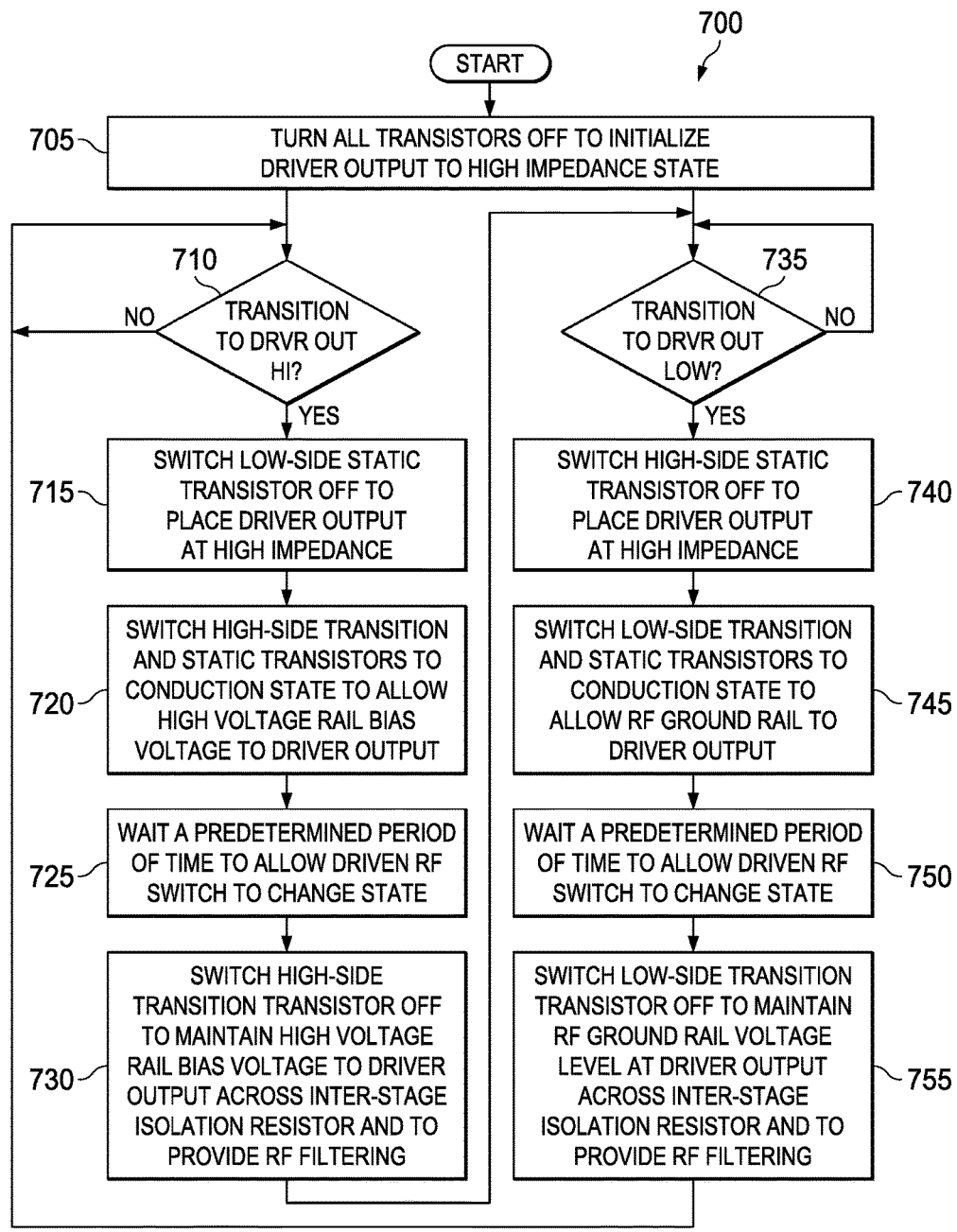
FIG. 7 is a flow diagram illustrating a method of generating a filtered actuator control signal according to various example sequences.

FIG. 7 is a flow diagram illustrating a method 700 of generating a filtered actuator control signal according to various example sequences. The method 700 describes sequences of activities performed by the dual-mode filtering actuator driver apparatus 100 described hereinabove with reference to FIG. 1. The method 700 includes transitioning to a high voltage state or an RF ground state from a high impedance state at the driver output node using a transition stage of the driver. The method 700 also includes disabling the transition stage and maintaining the selected state at the output node through an isolation resistor using the static stage. The method 700 further includes filtering RF noise at the output node using the isolation resistor and a capacitor coupled between a pad connector associated with the output node and the RF ground rail as further described hereinbelow.

The method 700 commences at block 705 with switching all actuator driver transistors to a non-conductive state to initialize the output node in the high impedance state. The method 700 continues at blocks 710 and 735 with determining whether to transition the driver output to a high or a low state, respectively.

If a decision is made to transition to output high, the method 700 includes switching the low-side static transistor off at block 715 to ensure that the output is in a high impedance state and to avoid a rail-to-rail crowbar current through the static stage in case the high-side static transistor is on. The method 700 also includes switching the high-side transition and static transistors to a conduction state to allow high voltage rail bias voltage to the driver output, at block 720. The method 700 further includes waiting a predetermined period of time to allow the driven RF actuator to change state, at block 725. The method 700 also includes switching the high-side transition transistor off following expiration of the predetermined RF actuator settling time, at block 730. Doing so maintains the high voltage rail bias to the driver output across the inter-stage isolation resistor. RF filtering is provided by the isolation resistor in RC combination with a capacitance at a driver output connector pad.

If a decision is made to transition to output low, the method 700 includes switching the high-side static transistor off at block 740 to ensure that the output is in a high impedance state and to avoid a rail-to-rail crowbar current through the static stage in case the low-side static transistor is on. The method 700 also includes switching the low-side transition and static transistors to a conduction state to allow RF ground potential to the driver output, at block 745. The method 700 further includes waiting a predetermined period of time to allow the driven RF actuator to change state, at block 750. The method 700 also includes switching the low-side transition transistor off following expiration of the predetermined RF actuator settling time, at block 755. Doing so maintains the RF ground potential at the driver output across the inter-stage isolation resistor. RF filtering is provided by the isolation resistor in RC combination with the capacitance at the driver output connector pad.

Apparatus, systems and methods described herein may be useful in applications other than controlling RF actuators while filtering noise to and from the actuators and associated drivers. The examples of the apparatus 100 and 400, the system 600 and the method 700 described herein provide a general understanding of the structures of various embodiments and the sequences of various methods.

Structures and methods described herein provide initial transition and then statically held drive signals to an RF actuator device or to an array of RF actuator devices such as may be included in a MEMS array. An inter-stage isolation resistor and a capacitor formed at the driver output connector pad form an RC low-pass filter to block spurious noise generated at the driver and/or within the switching circuitry associated with the driver high voltage power supply. The RC low-pass filter also filters RF energy from the RF actuator that might otherwise enter into and disrupt operation of the actuator driver. Some embodiments include an additional RC filter proximate to the output connector pad to block high levels of RF energy that may be present at an actuator device. The dual-mode driver character and integral filtering provided by these structures and methods increase reliability of actuator switching in a small form-factor.

In the drawings, arrows at one or both ends of connecting lines are intended to show the general direction of electrical current flow, data flow, logic flow, etc. Connector line arrows are not intended to limit such flows to a particular direction such as to preclude any flow in an opposite direction.

Modifications are possible in the described embodiments, and other embodiments are possible, within the scope of the claims.

What is claimed is:

1. An actuation system, comprising:
    an actuator driver array of dual-mode actuator drivers, each actuator driver including a transition stage configured to initiate a state change of a driver output signal, a static stage configured to maintain the state change of the driver output signal, and an isolation resistor configured to couple the driver output signal from the static stage to an output node of the actuator driver during a static mode of operation;
    an array of pad capacitors, each pad capacitor having: a first terminal at a connector pad communicatively coupled to the output node, a second terminal coupled to a radio frequency ("RF") ground rail, wherein the isolation resistor and the pad capacitor form a low-pass filter configured to filter RF harmonics from a respective actuator driver in the actuator driver array to respective actuator circuitry, and configured to filter RF energy generated outside of the respective actuator driver to the output node of the respective actuator driver; and
    an RF actuator array of RF actuator elements, a state of each element of the RF actuator array being controllable by a corresponding actuator driver in the actuator driver array.

2. The actuation system of claim 1, wherein the RF actuator array includes elements of a micro-electromechanical ("MEMS") array selected from a group consisting of a MEMS RF switching array, a MEMS tunable inductor array, a MEMS capacitor array, a MEMS switched capacitor array, and a MEMS varactor array.

3. The actuation system of claim 1, wherein states of the driver output signal of one of the actuator drivers includes a high bias voltage state substantially equal to a voltage of a power supply voltage rail, a low voltage state substantially equal to a voltage potential of the RF ground rail, and a high impedance state.

4. The actuation system of claim 1, wherein the transition stage of one of the actuator drivers includes:
    at least two transition stage transistors, the at least two transition stage transistors having a first current path coupled in series between a power supply voltage rail and the RF ground rail, the at least two transition stage transistors joined at an output node thereof, at least one of the at least two transition stage transistors configured to conduct during a state change at the output node and to be turned off at the end of a predetermined period of time after the state change at the output node.

5. The actuation system of claim 4, wherein the static stage of the one of the actuator drivers includes:
    at least two static stage transistors, the at least two static stage transistors having a second current path coupled in series between the power supply voltage rail and the RF ground rail and joined at an isolation node, at least one of the at least two static stage transistors configured to continue to conduct following the predetermined period of time after the state change in order to maintain the state change after the transition stage of the one of the actuator drivers becomes inactive.

6. The actuation system of claim 1, further comprising:
    an array of resistance/capacitance ("RC") low-pass pad filters, each RC pad filter proximate to a corresponding connector pad and configured to filter RF energy from a corresponding actuator element to a corresponding actuator driver.

* * * * *